US009899263B2

(12) United States Patent
Hsieh et al.

(10) Patent No.: US 9,899,263 B2
(45) Date of Patent: Feb. 20, 2018

(54) METHOD OF FORMING LAYOUT DESIGN

(71) Applicant: Taiwan Semiconductor Manufacturing Company, Ltd., Hsin-Chu (TW)

(72) Inventors: Tung-Heng Hsieh, Zhudong Town (TW); Chung-Te Lin, Tainan (TW); Sheng-Hsiung Wang, Zhubei (TW); Hui-Zhong Zhuang, Kaoshung (TW); Min-Hsiung Chiang, New Taipei (TW); Ting-Wei Chiang, New Taipei (TW); Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 93 days.

(21) Appl. No.: 15/150,149

(22) Filed: May 9, 2016

(65) Prior Publication Data

US 2016/0254190 A1    Sep. 1, 2016

Related U.S. Application Data

(63) Continuation of application No. 14/484,588, filed on Sep. 12, 2014, now Pat. No. 9,336,348.

(51) Int. Cl.
| | |
|---|---|
| *G06F 17/50* | (2006.01) |
| *H01L 21/8234* | (2006.01) |
| *H01L 27/02* | (2006.01) |
| *H01L 21/304* | (2006.01) |
| *H01L 29/66* | (2006.01) |
| *H01L 21/3213* | (2006.01) |
| *H01L 27/118* | (2006.01) |

(52) U.S. Cl.
CPC .... *H01L 21/82345* (2013.01); *G06F 17/5072* (2013.01); *H01L 21/3043* (2013.01); *H01L 21/823431* (2013.01); *H01L 27/0207* (2013.01); *H01L 29/66545* (2013.01); *H01L 29/66795* (2013.01); *H01L 21/32139* (2013.01); *H01L 27/11807* (2013.01)

(58) Field of Classification Search
CPC .................................................. G06F 17/5072
USPC ........................................................ 716/55
See application file for complete search history.

(56) References Cited

U.S. PATENT DOCUMENTS

| | | | |
|---|---|---|---|
| 6,578,183 B2 | 6/2003 | Cheong et al. | |
| 7,243,327 B1 | 7/2007 | Tain et al. | |

(Continued)

FOREIGN PATENT DOCUMENTS

| | | |
|---|---|---|
| JP | 2011187538 A | 9/2011 |
| KR | 1020080055213 A | 6/2008 |

(Continued)

*Primary Examiner* — Suchin Parihar
(74) *Attorney, Agent, or Firm* — Slater Matsil, LLP

(57) ABSTRACT

A method of forming a layout design for fabricating an integrated circuit (IC) is disclosed. The method includes identifying one or more areas in the layout design occupied by one or more segments of a plurality of gate structure layout patterns of the layout design; and generating a set of layout patterns overlapping the identified one or more areas. The plurality of gate structure layout patterns has a predetermined pitch smaller than a spatial resolution of a predetermined lithographic technology. A first layout pattern of the set of layout patterns has a width less than twice the predetermined pitch.

20 Claims, 11 Drawing Sheets

(56) References Cited

U.S. PATENT DOCUMENTS

| | | | |
|---|---|---|---|
| 7,257,784 B2 | 8/2007 | Cheng et al. | |
| 8,431,967 B2 | 4/2013 | Nakanishi et al. | |
| 8,669,596 B2 | 3/2014 | Tamaru | |
| 9,219,005 B2 * | 12/2015 | Or-Bach | B82Y 10/00 |
| 2006/0236284 A1 | 10/2006 | Kawahara | |
| 2009/0272982 A1 * | 11/2009 | Nakamura | H01L 29/66068 257/77 |
| 2012/0129301 A1 * | 5/2012 | Or-Bach | H01L 21/6835 438/129 |
| 2013/0122672 A1 * | 5/2013 | Or-Bach | H01L 21/8221 438/199 |
| 2013/0249110 A1 | 9/2013 | Griffith | |

FOREIGN PATENT DOCUMENTS

| | | |
|---|---|---|
| TW | 567528 B | 12/2003 |
| TW | 200634509 A | 10/2006 |
| TW | 200705230 A | 2/2007 |
| WO | 2011048737 A1 | 4/2011 |

* cited by examiner

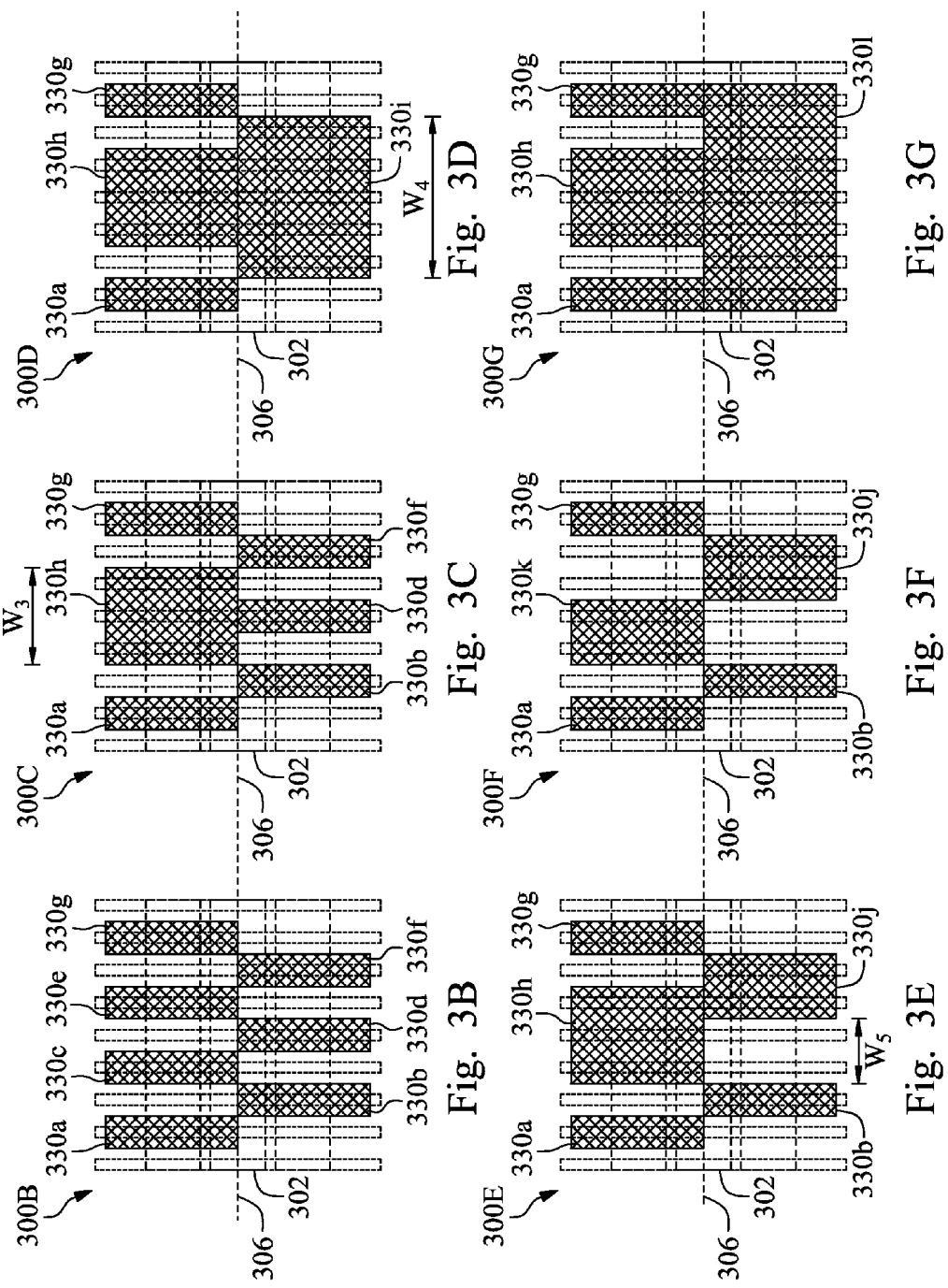

METHOD OF FORMING LAYOUT DESIGN

PRIORITY CLAIM AND CROSS-REFERENCE

This application claims the benefit to and is a continuation of U.S. patent application Ser. No. 14/484,588, filed on Sep. 12, 2014, and entitled "METHOD OF FORMING LAYOUT DESIGN," which application is incorporated herein by reference.

BACKGROUND

An integrated circuit (IC) is fabricated according to a layout design usable to form a plurality of masks for selectively forming or removing various layers of features, such as active regions, gate electrodes, various layers of isolation structures, and/or various layers of conductive structures. In some applications, an IC includes transistors having different threshold voltages. In one example, the transistors in the cells along a critical speed path of the IC having lower threshold voltages than those in the cells along a non-critical speed path of the IC. In another example, the gate structures at cell boundaries constitute dummy transistors and are adjusted to have higher threshold voltages than other functional transistors for reducing the current leakage through the dummy transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3I are diagrams of portions of various layout designs showing various examples for illustrating the operation of the method depicted in FIG. 2 in accordance with some embodiments.

DETAILED DESCRIPTION

Figure 1A:
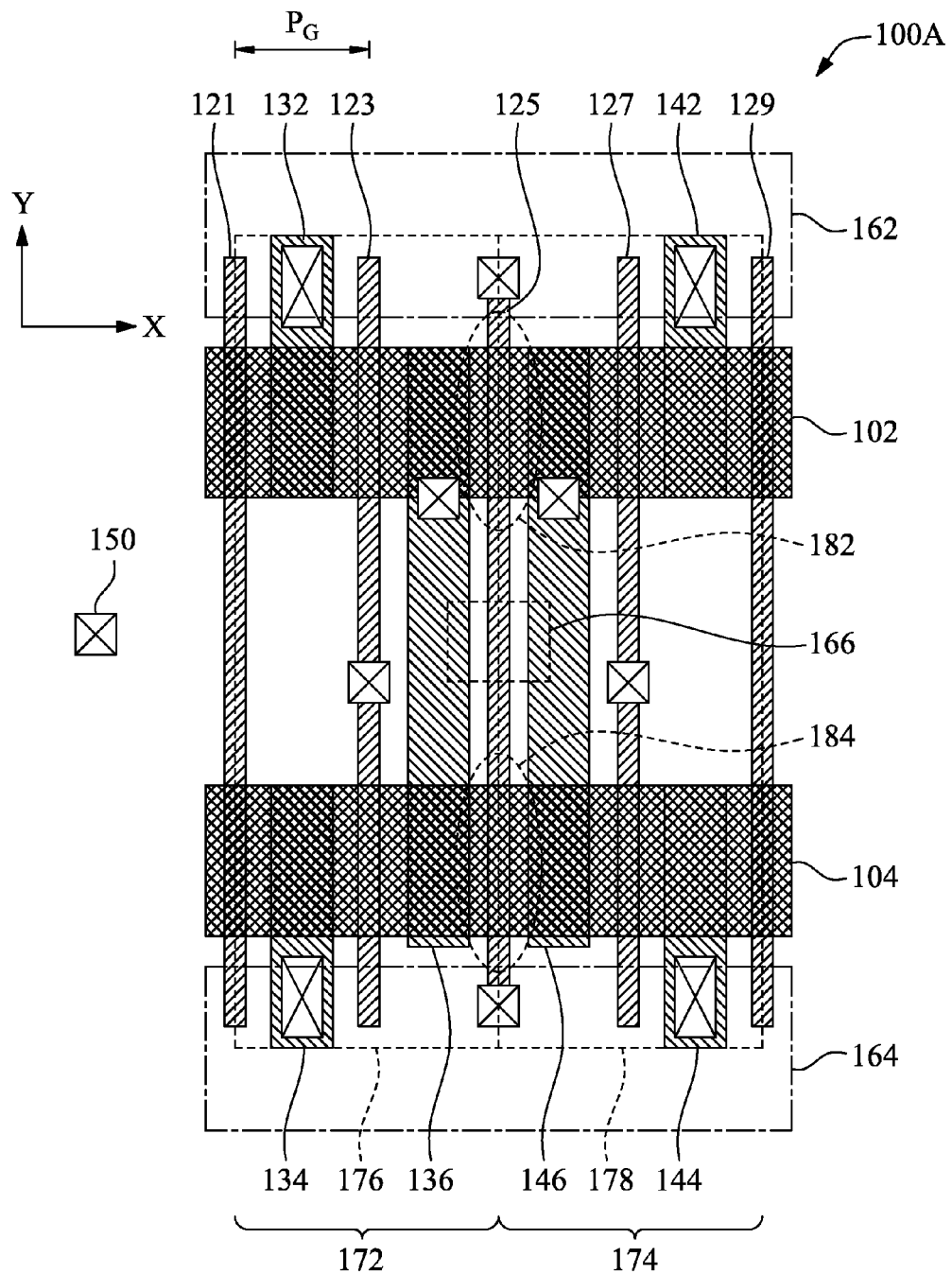
FIG. 1A is a diagram of a portion of a layout design of a circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a layout layer usable to for a plurality of gate structures has a predetermined pitch smaller than a spatial resolution of a predetermined lithographic technology. Also, a mask layout layer usable for forming a mask defining the areas for performing an electrical characteristic adjustment process of the resulting transistors has a minimum pitch equal the predetermined pitch. Compared with a mask layout layer having a minimum pitch greater than twice the predetermined pitch, the cost for forming a mask according the present disclosure is greater, but the overall gate density of the resulting integrated circuit (IC) is higher. In some embodiments, the overall cost for fabricating an IC according to the present disclosure is in fact lower than that fabricated according to a mask layout layer having a minimum pitch greater than twice the predetermined pitch.

FIG. 1A is a diagram of a portion of a layout design 100A of a circuit in accordance with some embodiments. Layout design 100A depicts overlapping layout patterns from various layout layers of layout design 100A. Some layout patterns and some layout layers of layout design 100A are simplified or omitted. Layout design 100A depicts a non-limiting example for facilitating the illustration of the present disclosure.

Layout design 100A includes a first oxide diffusion (OD) layout pattern 102, a second OD layout pattern 104, a plurality of gate structure layout patterns 121, 123, 125, 127, and 129, a plurality of conductive feature layout patterns 132, 134, 136, 142, 144, and 146, and a plurality of via layout patterns 150. Layout design 100A also includes a first power layout pattern 162, a second power layout pattern 164, and a gate structure cutting layout pattern 166. The components depicted in FIG. 1A are arranged to form two logic cells 172 and 174 encompassed by cell boundaries 176 and 178, respectively.

Cell boundary 176 has an upper edge 176a (FIG. 1C) running through the middle of the power layout pattern 162, a lower edge 176b (FIG. 1C) running through the middle of the power layout pattern 164, a left edge 176c (FIG. 1C) overlapping gate structure layout pattern 121, and a right edge 176d (FIG. 1C) overlapping gate structure layout pattern 125. Cell boundary 178 has an upper edge 178a (FIG. 1C) running through the middle of the power layout pattern 162, a lower edge 178b (FIG. 1C) running through the middle of the power layout pattern 164, a left edge 178c (FIG. 1C) overlapping gate structure layout pattern 125, and a right edge 178d (FIG. 1C) overlapping gate structure layout pattern 129. In the embodiment depicted in FIG. 1A, the right edge 176d of cell boundary 176 and the left edge 176c of cell boundary 178 also overlap.

OD layout pattern 102 is usable to form an N-well region extending along a direction X through cells 172 and 174; and OD layout pattern 104 is usable to form a P-well region extending along direction X through cells 172 and 174. Power layout pattern 162 is usable to form a power rail extending along direction X through cells 172 and 174 and configured to carry a power supply voltage; and power layout pattern 164 is usable to form a power rail extending along direction X through cells 172 and 174 and configured to carry a ground references voltage.

Conductive feature layout pattern 132 is usable to form a conductive feature connecting the N-well region defined by OD layout pattern 102 and the power rail defined by power layout pattern 162 through a via plug defined by a corresponding via layout pattern 150. Conductive feature layout pattern 134 is usable to form a conductive feature connecting the P-well region defined by OD layout pattern 104 and the power rail defined by power layout pattern 164 through a via plug defined by a corresponding via layout pattern 150. Conductive feature layout pattern 136 is usable to form a conductive feature connecting the N-well region defined by OD layout pattern 102 and the P-well region defined by OD layout pattern 104. Gate structure layout pattern 123 is between conductive feature layout pattern 136 and conductive feature layout patterns 132 and 134 and is usable to form gate structures over the N-well region and the P-well region.

Gate structure layout patterns 121, 123, 125, 127, and 129 extend along a direction Y and have a pitch $P_G$ measurable along direction X. Gate structure layout patterns 121, 123, 125, 127, and 129 are usable to form a plurality of hard mask features or gate electrode features from which a plurality of gate electrodes is made. In some embodiments, the pitch $P_G$ is smaller than a spatial resolution of a predetermined lithographic technology, and therefore gate structure layout patterns 121, 123, 125, 127, and 129 are usable for a multiple-patterning process based on the predetermined lithographic technology.

Gate structure layout pattern 123, conductive feature layout pattern 132, and conductive feature layout pattern 136 are usable of forming a P-type transistor having a source (corresponding to layout pattern 132), a drain (layout pattern 136), and a gate (layout pattern 123). Gate structure layout pattern 123, conductive feature layout pattern 134, and conductive feature layout pattern 136 are usable of forming an N-type transistor (corresponding to layout pattern 134), a drain (layout pattern 136), and a gate (layout pattern 123). The above-listed features together are usable of forming an inverter having an input (corresponding to layout pattern 123) and an output (layout pattern 136). As such, cell 172 is an inverter cell.

In cell 174, gate structure layout pattern 127 corresponds to gate structure layout pattern 123; conductive feature layout pattern 142 corresponds to conductive feature layout pattern 132; conductive feature layout pattern 144 corresponds to conductive feature layout pattern 134; and conductive feature layout pattern 146 corresponds to conductive feature layout pattern 136. Therefore, gate structure layout pattern 127, conductive feature layout pattern 142, and conductive feature layout pattern 146 are usable of forming a P-type transistor; gate structure layout pattern 127, conductive feature layout pattern 144, and conductive feature layout pattern 146 are usable of forming an N-type transistor; and cell 174 is also an inverter cell.

Gate structure layout pattern 125, OD layout pattern 102, and conductive feature layout patterns 136 and 146 are usable of forming a dummy P-type transistor 182. Gate structure layout pattern 125, OD layout pattern 104, and conductive feature layout patterns 136 and 146 are also usable of forming a dummy N-type transistor 184. In order to isolate cells 172 and 174, dummy transistors 182 and 184 are turned off by tying the gate electrode (corresponding to layout pattern 125) of dummy transistor 182 to the power rail (layout pattern 162); tying the gate electrode (layout pattern 125) of dummy transistor 184 to the power rail (layout pattern 164); and removing a portion of the gate electrode corresponding to layout pattern 125 that is encompassed by gate structure cutting layout pattern 166.

Figure 1B:
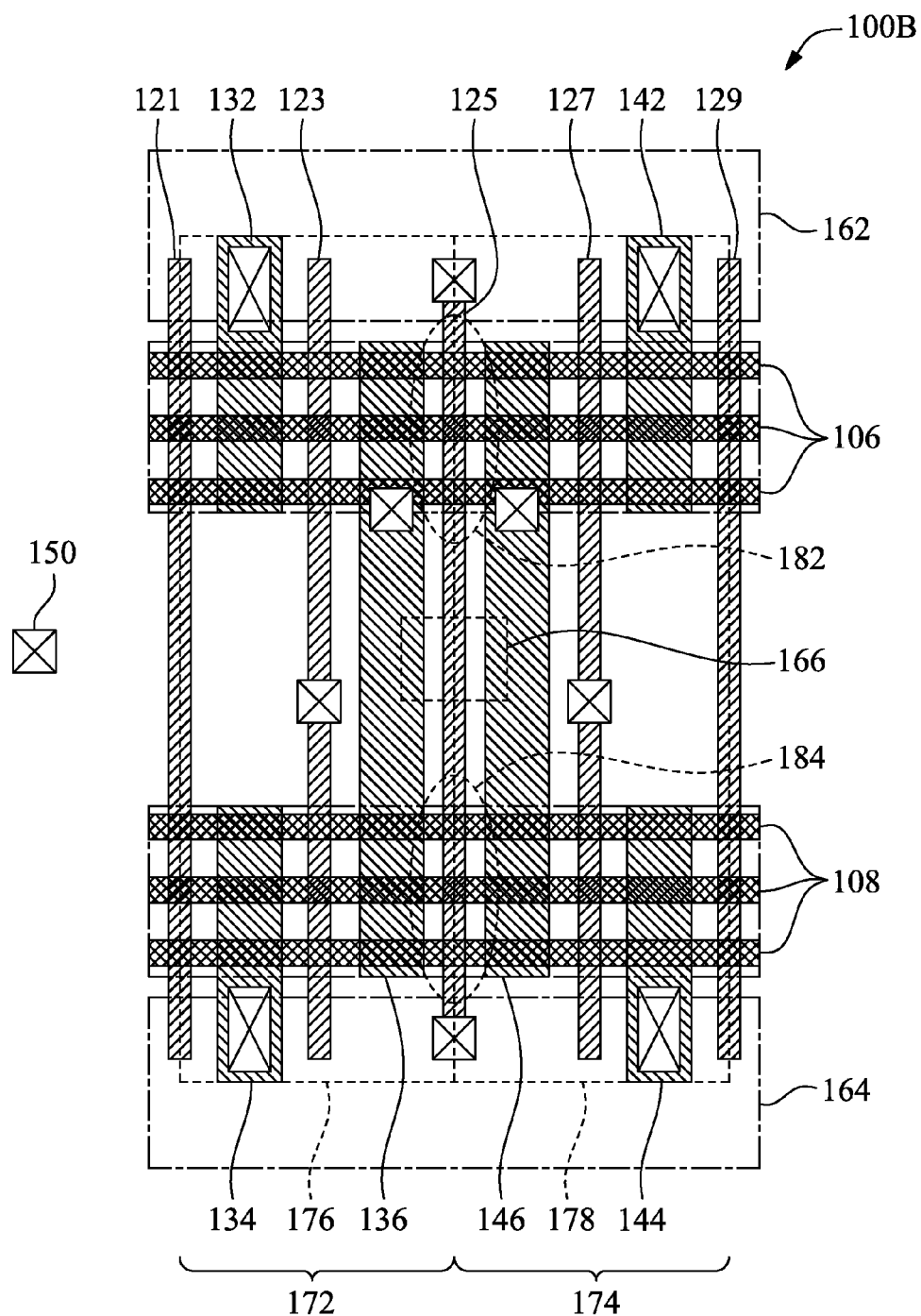
FIG. 1B is a diagram of a portion of a layout design of another circuit in accordance with some embodiments.

FIG. 1B is a diagram of a portion of a layout design 100B of a circuit in accordance with some embodiments. Components in FIG. 1B that are the same or similar to those in FIG. 1A are given the same or similar reference numbers. Layout design 100B depicts another non-limiting example for facilitating the illustration of the present disclosure.

Compared with layout design 100A, in layout design 100B, the OD layout pattern 102 and 104 are replaced and/or supplemented by fin structure layout patterns 106 and 108. Fin structure layout patterns 106 and 108 are usable to form a plurality of fin structures over a substrate of the circuit. The resulting transistors fabricated according to layout design 100B have a multi-gate architecture and sometimes also known as FinFETs.

Figure 1C:
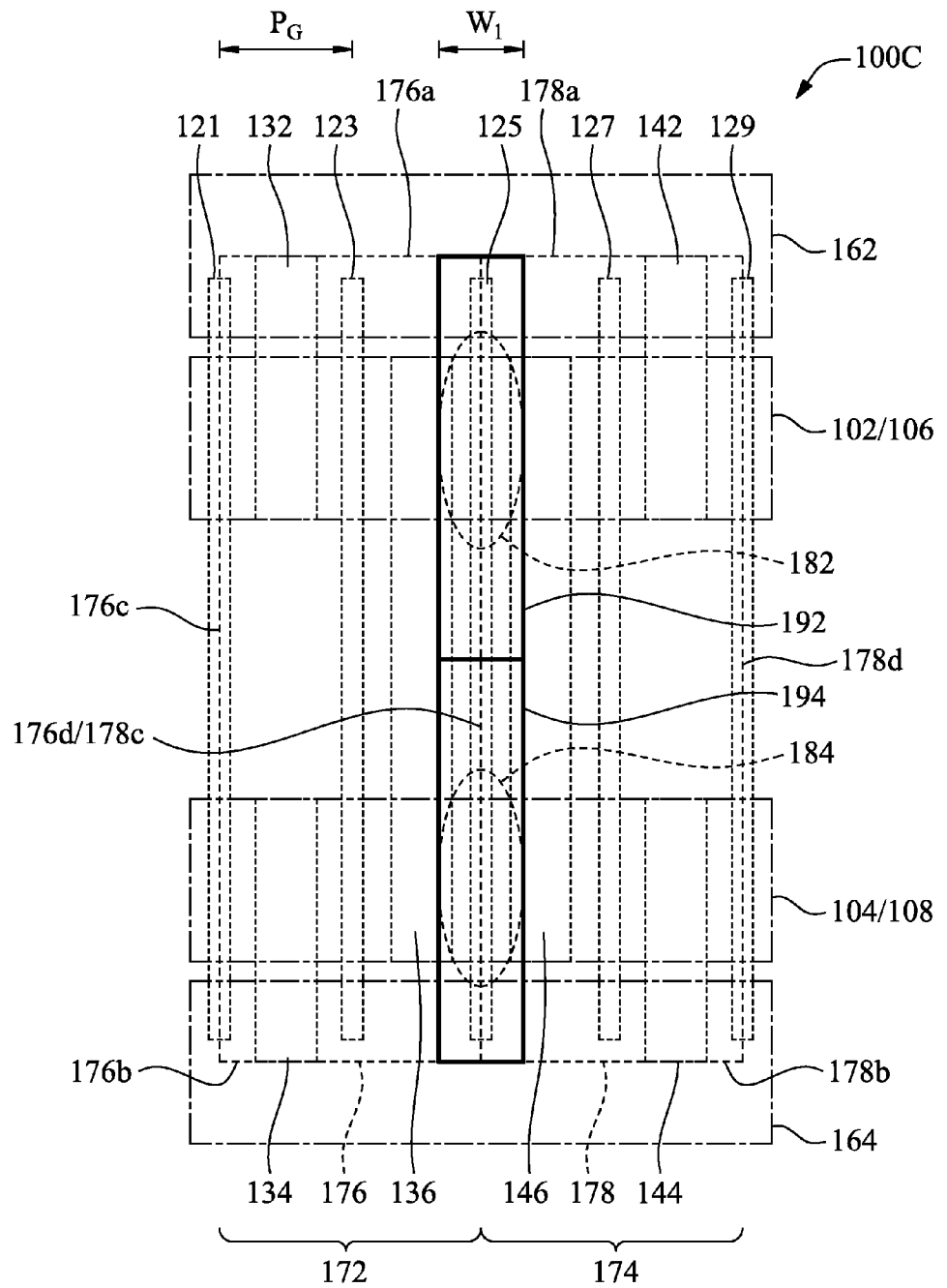
FIG. 1C is a diagram of a portion of the layout design corresponding to the circuit of FIG. 1A or FIG. 1B in accordance with some embodiments.

FIG. 1C is a diagram of a portion of the layout design 100C corresponding to the circuit of FIG. 1A or FIG. 1B in accordance with some embodiments. Components in FIG. 1C that are the same or similar to those in FIG. 1A of FIG. 1B are given the same or similar reference numbers. Layout design 100C summarizes the examples as illustrated in FIGS. 1A and 1B and de-emphasized or omitted various layout patterns in FIGS. 1A and 1B for facilitating the illustration of the present disclosure.

As illustrated above in conjunction with FIG. 1A, the dummy transistors 182 and 184 corresponding to gate electrode structure layout pattern 125 are turned off. To reduce the leakage current through the dummy transistors 182 and 184, the dummy transistors are subject to be further processed to increase their threshold voltages. Therefore, layout patterns 192 and 194 are introduced to define the areas subject to an electrical characteristic tuning process. In some embodiments, the layout patterns 192 and 194 are also usable for adjusting the electrical characteristics of functional transistors, such as the transistors constituting the P-type and N-type transistors of the inverters corresponding to gate structure layout pattern 123 and 127.

In some embodiments, layout patterns 192 and 194 are usable to define openings in a mask layer that expose the areas subject to the electrical characteristic tuning process. In some embodiments, layout patterns 192 and 194 are usable to define blocking areas in a mask layer for exposing the areas on which the electrical characteristic tuning process will be performed. In some embodiments, the electrical characteristic tuning process is usable for leakage reduction of a dummy transistor of the IC or power adjustment of a functional transistor of an integrated circuit. In some embodiments, suitable electrical characteristic tuning processes includes a threshold voltage tuning process or a gate structure trimming process. In some embodiments, the affected electrical characteristics of the transistors underwent the tuning processes includes their corresponding threshold voltages, turn-on current, or leakage current.

In some embodiments, layout patterns 192 and 194 have a width $W_1$ less than twice the pitch $P_G$. In some embodiments, width $W_1$ equals pitch $P_G$. In some embodiments, layout patterns 192 and 194 are formed on a mask layout layer, and the mask layout layer has a minimum pitch equals pitch $P_G$.

Figure 2:
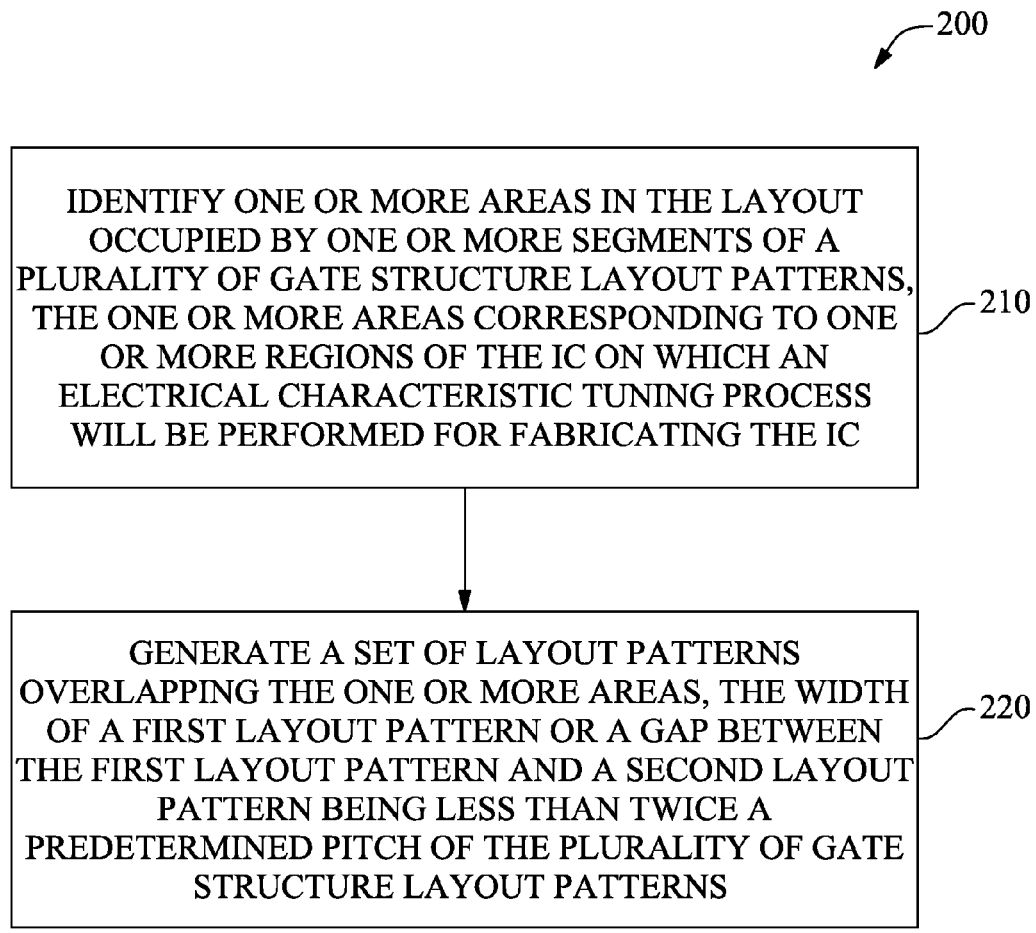
FIG. 2 is a flow chart of a method of forming a layout design in accordance with some embodiments.

FIG. 2 is a flow chart of a method 200 of forming a layout design in accordance with some embodiments. It is understood that additional operations may be performed before, during, and/or after the method 200 depicted in FIG. 2, and that some other processes may only be briefly described herein.

Method 200 begins with operation 210, where one or more areas in the layout design occupied by one or more segments of a plurality of gate structure layout patterns of the layout design are identified. The one or more identified areas correspond to one or more regions of the IC subject to an electrical characteristic tuning process for fabricating the IC. In some embodiments, the purpose of performing the electrical characteristic tuning process is to increase or decrease threshold voltages of corresponding transistors.

The method proceeds to operation 220, where a set of layout patterns overlapping the one or more areas is generated in a mask layout layer of the layout design. The plurality of gate structure layout patterns has a predetermined pitch. The set of layout patterns has a minimum pitch equals to the predetermined pitch. In some embodiments, a width of a first layout pattern of the set of layout patterns or a gap between the first layout pattern and a second layout pattern set of layout patterns is less than twice the predetermined pitch of the plurality of gate structure layout patterns. In some embodiments, the width of the first layout pattern of the set of layout patterns is an integer multiple of the predetermined pitch. In some embodiments, the gap between the first layout pattern and the second layout pattern set of layout patterns is an integer multiple of the predetermined pitch.

Implementation of the method 200 of FIG. 2 will now be explained by way of several examples. FIGS. 3A-3I are diagrams of portions of various layout designs in accordance with some embodiments.

Figure 3A:
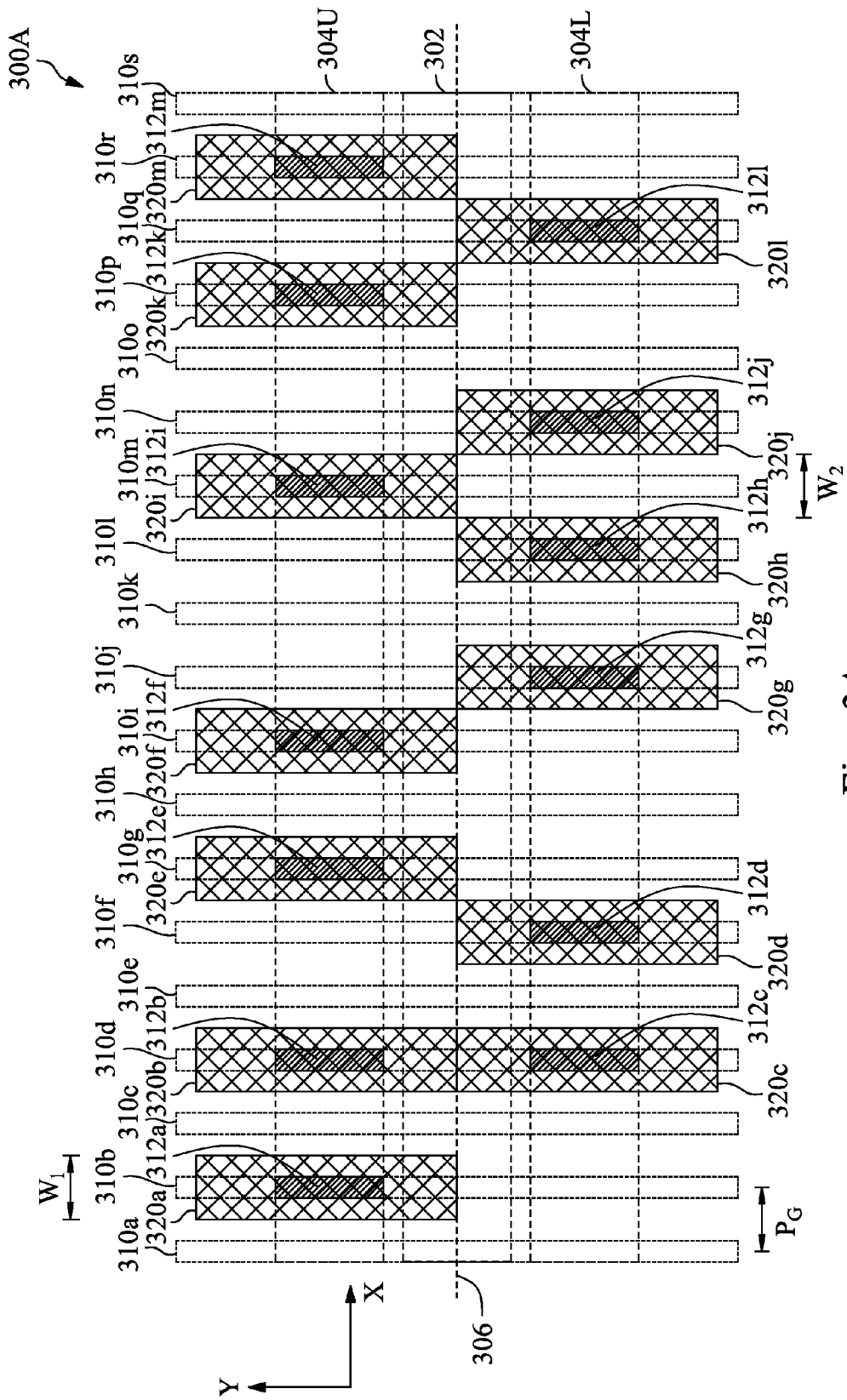

FIG. 3A is a diagram of a portion of a layout design 300A for fabricating an IC in accordance with some embodiments. Layout design 300A is usable to show various example layout patterns in the mask layout layer generated according to method 200.

Layout design 300A includes a power layout pattern 302 corresponding to power layout pattern 164 in FIGS. 1A-1C, a first OD layout pattern 304U corresponding to OD layout pattern 104, and a second OD layout pattern 304L also corresponding to OD layout pattern 104 and being an mirrored layout pattern of OD layout pattern 304U about power layout pattern 302. A reference line 306 corresponding to edges of logic cells, such as edge 176b and 178b, runs through the middle of the power layout pattern 302.

Layout design 300A further includes a plurality of gate structure layout patterns 310a-310s and a set of layout patterns 320a-320m generated by a process corresponding to method 200. The plurality of gate structure layout patterns 310a-310s extends along a direction Y and has a predetermined pitch $P_G$ measurable along a direction X. In some embodiments, the pitch $P_G$ is smaller than a spatial resolution of a predetermined lithographic technology, and therefore gate structure layout patterns 310a-310s are usable for a multiple-patterning process based on the predetermined lithographic technology.

One or more areas m the layout design 300A occupied by one or more segments 312a-312m of the plurality of gate structure layout patterns 310a-310s are identified such that the one or more segments 312a-312m indicate the corresponding transistors that are subject to electrical characteristic tuning. An electrical characteristic tuning process will be performed for fabricating the IC, and the set of layout patterns 320a-320m corresponds to one or more openings or blocking features to be formed in a mask layer prior to performing the electrical characteristic tuning process.

Each layout pattern of the set of layout patterns 320a-320m has a width W1 measurable along the direction X. Width $W_1$ is less than twice the predetermined pitch $P_G$. In some embodiments, width $W_1$ equals predetermined pitch $P_G$. The set of layout patterns 320a-320m demonstrates some of many possible layout combinations of the layout patterns of the mask layout layer.

In one example, layout pattern 320a has an edge overlapping a cell boundary represented by reference line 306 without abutting any other layout patterns of the mask layout layer. In another example, layout patterns 320b and 320c each have an edge overlapping the cell boundary 306, and layout patterns 320b and 320c abut each other at the corresponding edges that overlap cell boundary 306.

In another example, layout patterns 320d and 320e each have an edge overlapping the cell boundary 306, and a corner of layout pattern 320e and a corner of layout pattern 320e on the edges overlapping cell boundary 306 abut each other. In another example, layout patterns 320f and 320g have an arrangement similar to that of layout patterns 320d and 320e except being mirrored about a reference axis in parallel with the direction Y.

In another example, layout patterns 320h, 320i, and 320j each have an edge overlapping the cell boundary 306. A left corner of layout pattern 320i and a corner of layout pattern 320h on the edges overlapping cell boundary 306 abut each other; and a right corner of layout pattern 320i and a corner of layout pattern 320j on the edges overlapping cell boundary 306 abut each other. Layout patterns 320h and 320j are separated by a gap having a width $W_2$ measurable along the direction X. Width $W_2$ is less than twice the predetermined pitch $P_G$. In some embodiments, width $W_2$ equals predetermined pitch $P_G$. In another example, layout patterns 320k, 320l, and 320m have an arrangement similar to that of layout patterns 320h, 320i, and 320j except being mirrored about a reference axis in parallel with the direction X.

FIGS. 3B-3I are diagrams of portions of layout designs 300B-300I in accordance with some embodiments. FIGS. 3B-3I depicts more example layout patterns as combinations based on the examples depicted in FIG. 3A. Components in FIGS. 3B-3I that are the same or similar to those in FIG. 3A are given the same or similar reference numbers. Reference numbers for gate structure layout patterns and OD layout patterns are omitted for clarity.

In FIG. 3B, layout design 300B includes a set of layout patterns 330a-330g for forming the mask layer as illustrated above. Each layout patterns of the set of layout patterns 330a-330g has a width $W_1$ and is arranged along the reference line 306. Layout patterns 330a-330g abut one another only at the corresponding corners overlapping cell boundary represented by reference line 306. Layout patterns 330a, 330c, 330e, and 330g are separated from one another by corresponding gaps having a width $W_2$. Layout patterns 330b, 330d, and 330f are separated from one another by corresponding gaps having a width $W_2$. In some embodiments, width $W_1$ and width $W_2$ equal the predetermined pitch $P_G$ of the gate structure layout patterns.

In FIG. 3C, compared with layout design 300B, layout patterns 330c and 330e are replaced by layout pattern 330h in layout design 300C. Layout pattern 330h corresponds to an area covering three consecutive gate structure layout patterns and suitable to accommodate three unit layout patterns that has a width of the predetermined pitch $P_G$. Here, layout pattern 330h has a width $W_3$ equals three times of the predetermined pitch $P_G$.

In FIG. 3D, compared with layout design 300C, layout patterns 330b-330f are replaced by layout pattern 330i in layout design 300D. Layout pattern 330i corresponds to an area covering five consecutive gate structure layout patterns and suitable to accommodate five unit layout patterns (such as layout pattern 320a in FIG. 3A) that has a width of the predetermined pitch $P_G$. Here, layout pattern 330i has a width $W_4$ equals five times of the predetermined pitch $P_G$.

In FIG. 3E, compared with layout design 300C, layout patterns 330d and 330f are replaced by layout pattern 330j in layout design 300E. Layout pattern 330j corresponds to an area covering two consecutive gate structure layout patterns and suitable to accommodate two unit layout patterns that has a width of the predetermined pitch $P_G$. Moreover, layout pattern 330b and 330j are separated by a gap having a width Ws. The gap between layout pattern 330b and 330j extends over an area corresponding to two consecutive gate structure layout patterns and suitable to accommodate two unit layout patterns that has a width of the predetermined pitch $P_G$. Here, the width $W_5$ of the gap equals two times of the predetermined pitch $P_G$.

As a variation of the embodiments depicted in FIG. 3C and FIG. 3D, in some embodiments, a layout pattern has a width that is an integer multiple of the predetermined pitch $P_G$. As a variation of the embodiment depicted in FIG. 3E, in some embodiments, two layout patterns are separated by a gap having a width that is an integer multiple of the predetermined pitch $P_G$.

For example, in FIG. 3F, compared with layout design 300E, layout pattern 330h is replaced by layout pattern 330k in layout design 300F. Layout pattern 330k has a width of twice the predetermined pitch $P_G$ instead of three times of the predetermined pitch $P_G$ as layout pattern 330h. A gap between layout pattern 330k and layout pattern 330g has a width of twice the predetermined pitch $P_G$. In yet another example as depicted in FIG. 3G, compared with layout design 300E, layout patterns 330b and 330j are replaced by layout pattern 330l in layout design 300G. Layout pattern 330l has a width of seven times the predetermined pitch $P_G$.

Figure 3I:
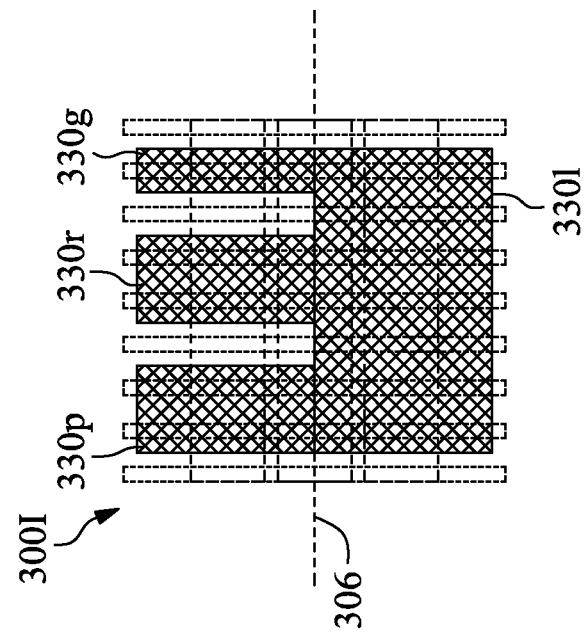
Figure 3H:
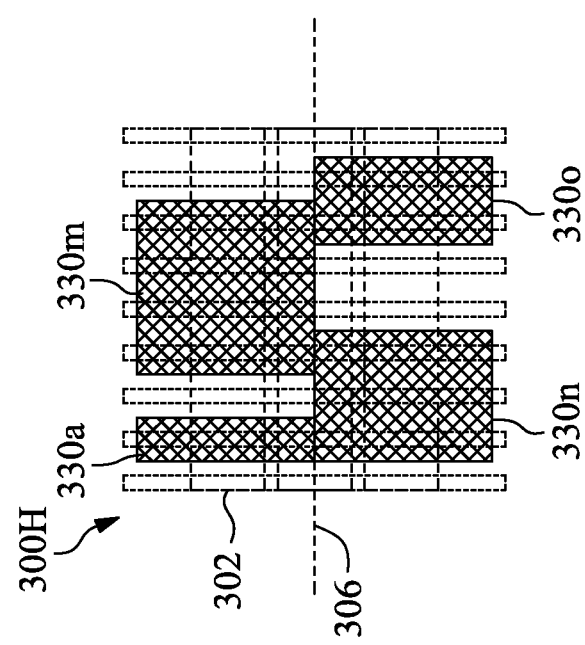

FIG. 3H depicts yet another example layout design 300H, which includes layout patterns 330a, 330m, 330n, and 330o. Layout pattern 330a has a width of a single predetermined pitch $P_G$. Layout pattern 330m has a width of four times the predetermined pitch $P_G$. Layout pattern 330n has a width of three times the predetermined pitch $P_G$. Layout pattern 330m has a width of twice the predetermined pitch $P_G$. Layout pattern 330n abuts layout pattern 330a and layout pattern 330m at cell boundary 306. Layout pattern 330m abuts layout pattern 330n as well as layout pattern 330o at cell boundary 306. Layout pattern 330a and layout pattern 330m are separated by a gap having a width of a single predetermined pitch $P_G$. Layout pattern 330n and layout pattern 330o are separated by a gap having a width of twice the predetermined pitch $P_G$.

FIG. 3I depicts yet another example layout design 300I, which includes layout patterns 330l, 330p, 330r, and 330g. Layout pattern 330g has a width of a single predetermined pitch $P_G$. Layout pattern 330l has a width of seven times the predetermined pitch $P_G$. Layout pattern 330p has a width of twice the predetermined pitch $P_G$. Layout pattern 330r has a width of twice the predetermined pitch $P_G$. Layout pattern 330l abuts layout patterns 330p, 330r, and 330g at cell boundary 306. Layout pattern 330p and layout pattern 330r are separated by a gap having a width of a single predetermined pitch $P_G$. Layout pattern 330r and layout pattern 330g are separated by a gap having a width of a single predetermined pitch $P_G$.

Figure 4A:
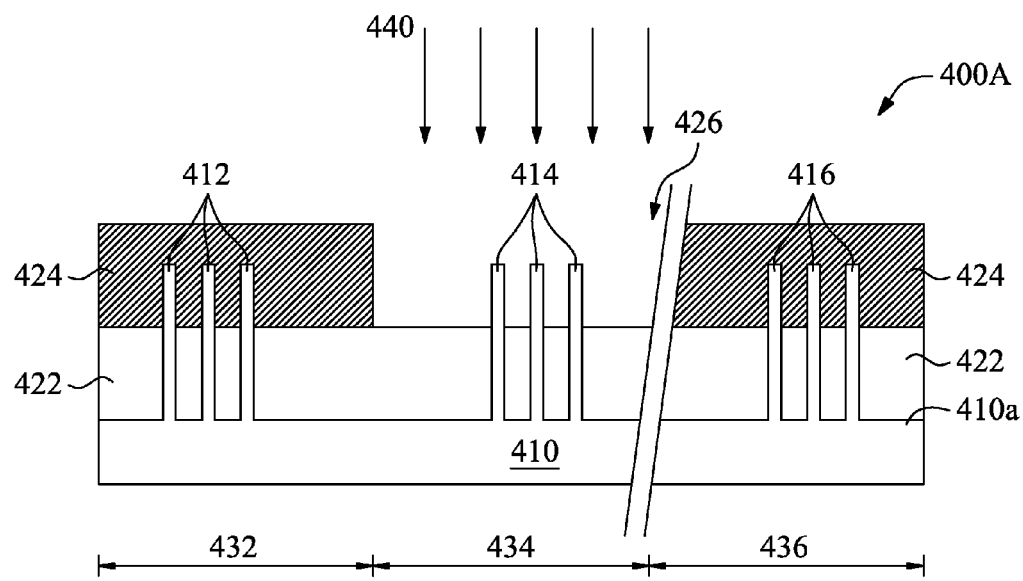
FIGS. 4A-4B are cross-sectional views of portions of different ICs usable for illustrating two different threshold voltage tuning processes in accordance with some embodiments.

FIG. 4A is a cross-sectional view of a portion of an IC 400A usable for illustrating a first example threshold voltage tuning processes in accordance with some embodiments. FIG. 4A is taken along a reference surface that does not cut through the corresponding gate structures.

IC 400A includes a substrate 410, a plurality of fin structures 412, 414, and 416 protruding from an upper surface 410a of substrate 410, an isolation layer 422 over the upper surface 410a of substrate 410 and partially cover the fin structures 412, 414, and 416, and a mask layer 424 over isolation layer 422 and fin structures 412 and 416. Various components in IC 400A are arranged in a first transistor region 432, a second transistor region 434, and a third transistor region 436. First transistor region 432 corresponds to a transistor of a first type, and second transistor region 434 and third transistor region 436 correspond to transistor of a second type. In some embodiments, a transistor of the first type refers to an N-type transistor, and a transistor of the second type refers to a P-type transistor. In some embodiments, a transistor of the first type refers to a P-type transistor, and a transistor of the second type refers to an N-type transistor.

Mask layer 424 has an opening 426 defined therein and exposing a portion of fin structures 414. In some embodiments, the mask layer 422 is formed according to a mask layout layer including the set of layout patterns 320a-320m in FIG. 3A, or 330a-330h in FIGS. 3B-3G. In some embodiments, the opening 426 is defined according to the set of layout patterns 320a-320m or 330a-330h. In FIG. 4A, transistors to be formed in transistor regions 434 and 436 are of the same type. However, the transistor formed in transistor region 434 is exposed by the opening 426 and thus will be process to adjust the electrical characteristic thereof.

For example, an implantation process 440 is performed to adjust an effective doping concentration at fin structures 414. In some embodiments, implantation process 440 increases or decrease the effective doping concentration at fin structures 414 in comparison with a counterpart fin structures 416 usable to form transistors of the same type. As a result, a threshold voltage of the resulting transistor at transistor region 434 is different from that of the transistor in transistor region 436. In some embodiments, if the resulting transistors in regions 434 and 436 are N-type transistors, increasing P-type doping concentration of fin structure 414 results in a smaller threshold voltage, and decreasing P-type doping concentration of fin structure 414 results in a greater threshold voltage. In some embodiments, if the resulting transistors in regions 434 and 436 are P-type transistors, increasing N-type doping concentration of fin structure 414 results in a smaller threshold voltage, and decreasing N-type doping concentration of fin structure 414 results in a greater threshold voltage.

Figure 4B:
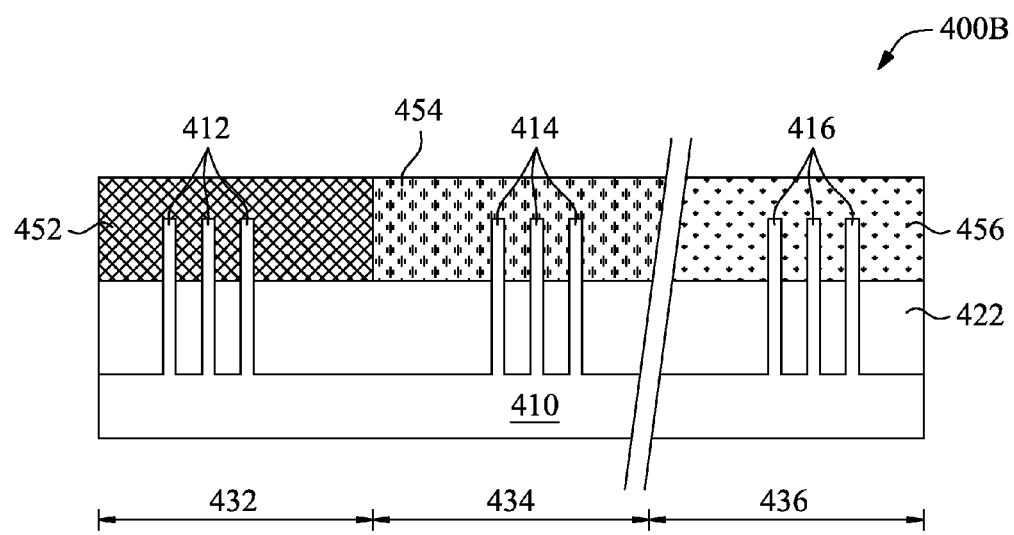

FIG. 4B is a cross-sectional view of a portion of an IC 400B usable for illustrating a second example threshold voltage tuning processes in accordance with some embodiments. Components in FIG. 4B that are the same or similar to those in FIG. 4A are given the same reference numbers. FIG. 4B is taken along a reference surface that cuts through the corresponding gate structures 452, 454, and 456.

Compared with IC 400A, instead of performing implantation process 440 in the opening 426, gate electrode structure 454 is formed to have different material and/or structure than those of electrode structure 452 and 456. In some embodiments, gate electrode structure 454 has a material having a work function metal different than that of gate electrode 456. As a result, a threshold voltage of the resulting transistor at transistor region 434 is different from that of the transistor in transistor region 436.

In some embodiments, the processes as illustrated in FIGS. 4A and 4B are both performed to adjust the threshold voltage of a transistor in an IC. In some embodiments, only one of the processes as illustrated by FIGS. 4A and 4B is performed to adjust the threshold voltage of a transistor in an IC.

In some embodiments, the dummy transistors corresponding to dummy transistors 182 and 184 in FIG. 1A-1C will be exposed or blocked according to the layout patterns corresponding to layout patterns 192 and 194 when performing the threshold voltage tuning processes.

Figure 5A:
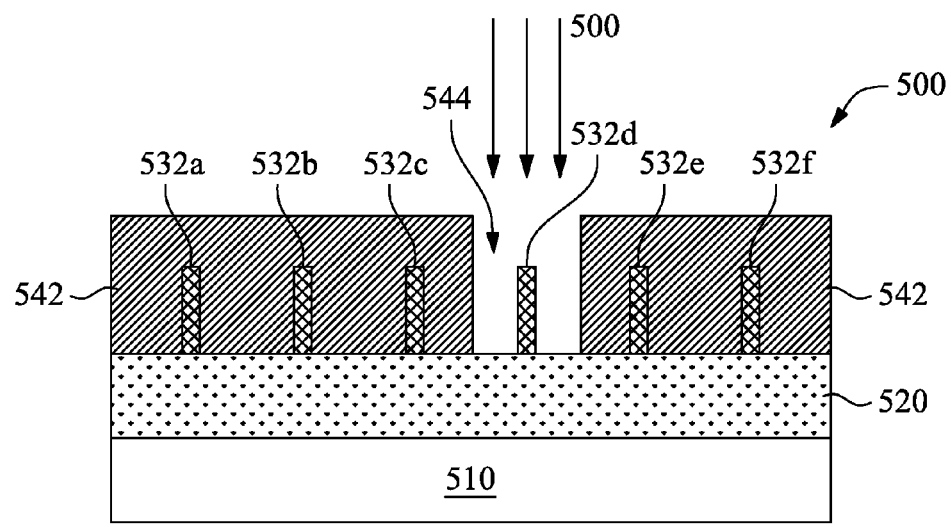
FIGS. 5A-5B are cross-sectional views of a portion of an IC usable for illustrating a gate structure trimming process in accordance with some embodiments.
Figure 5B:
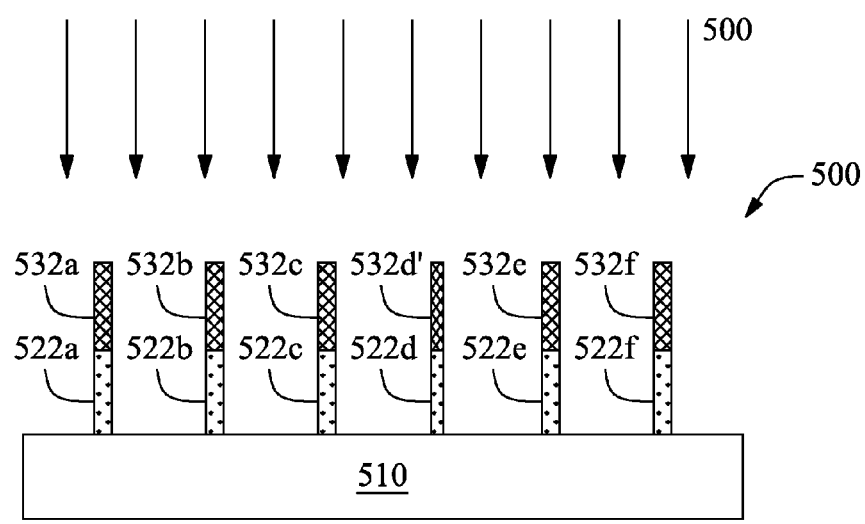

FIGS. 5A-5B are cross-sectional views of a portion of an IC 500 usable for illustrating a gate structure trimming process in accordance with some embodiments.

In FIG. 5A, IC 500 includes a substrate 510, a polysilicon layer 520 over substrate 510, a plurality of hard mask features 532a-532f over polysilicon layer 520, and a mask layer 542 over polysilicon layer 520 and hard mask features 532a-532c and 532e-532f. Hard mask features 532a-532f are patterned according to a plurality of gate structure layout patterns, such as layout patterns 121-129 (FIG. 1) or 310a-310s (FIG. 3A). Mask layer 542 has an opening 544 defined therein, and opening 544 is formed according to a mask layout layer having a set of layout patterns, such as layout patterns 320a-320m (FIG. 3A) or 330a-330h (FIGS. 3B-3G). In FIG. 5A, a first etching process 550 is performed to reduce a width of hard mask features 532d.

In FIG. 5B, after the first etching process, hard mask features 532d is trimmed to become hard mask features 532d', which has a smaller width. Mask layer 542 is removed, and then a second etching process 550 is performed to pattern polysilicon layer 520 into a plurality of polysilicon features 522-522f. Polysilicon features 522a-522f are usable as gate structures or dummy gate structures subject to a subsequent gate replacement process. Because polysilicon feature 522d has a width smaller than that of other polysilicon features 522a-522c and 522e-522f, a resulting transistor corresponding to polysilicon feature 522d has a faster operating speed than resulting transistors of the same type corresponding to polysilicon feature 522a-522c and 522e-522f.

In some embodiments, the dummy transistors corresponding to dummy transistors 182 and 184 in FIG. 1A-1C will be blocked according to the layout patterns corresponding to layout patterns 192 and 194 when performing the gate structure trimming process.

Figure 6:
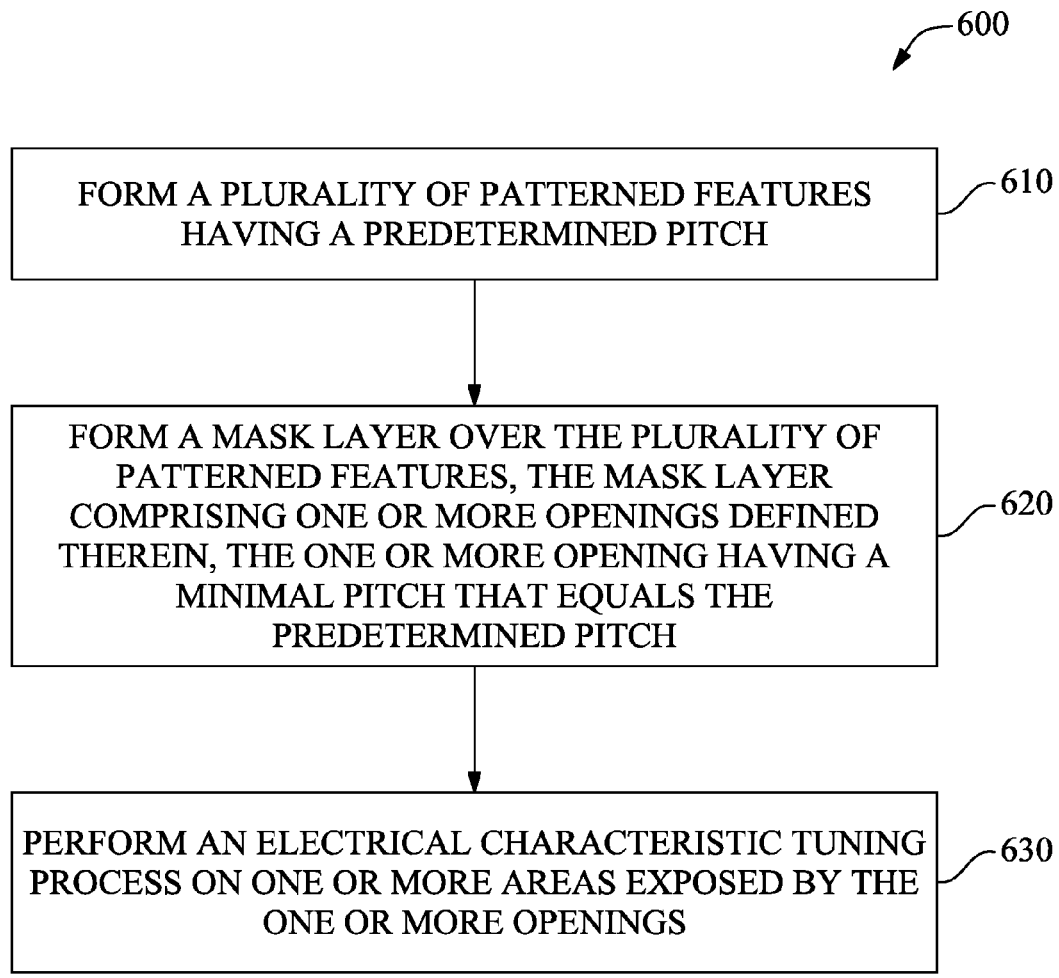
FIG. 6 is a flow chart of a method of fabricating an IC in accordance with some embodiments.

FIG. 6 is a flow chart of a method 600 of fabricating an IC in accordance with some embodiments. It is understood that additional operations may be performed before, during, and/or after the method 600 depicted in FIG. 6, and that some other processes may only be briefly described herein.

Method 600 begins with operation 610, where a plurality of patterned features is formed according to a plurality of gate structure layout patterns, such as layout patterns 121-129 (FIG. 1) or 310a-310s (FIG. 3A). The plurality of patterned features is formed using a multiple-patterning process based on a predetermined lithographic technology. The plurality of patterned features thus extends along a first direction corresponding to direction Y in FIG. 3A and has a predetermined pitch corresponding to pitch $P_G$ in FIG. 3A measurable along direction X. In some embodiments, the pitch $P_G$ is smaller than a spatial resolution of the predetermined lithographic technology. In some embodiments, the plurality of patterned features corresponds to hard mask features 532a-532f in FIG. 5A or polysilicon features formed according to hard mask features 522a-522f.

The process proceeds to operation 620, where a mask layer is formed over the plurality of patterned features. The mask layer includes one or more openings defined therein, and the one or more openings exposing one or more areas corresponding to one or more segments of the plurality of patterned features. In some embodiments, the mask layer corresponds to mask layer 542 in FIG. 5A with opening 544 defined therein. The one or more openings are defined according to a set of layout patterns of a mask layout layer, such as layout patterns 320a-320m or 330a-330l in FIGS. 3A-3G. Therefore, in some embodiments, the one or more openings have a minimal pitch that equals the predetermined pitch $P_G$ of the plurality of patterned features.

The process proceeds to operation 630, where an electrical characteristic tuning process is performed on the exposed one or more areas. In some embodiments, the electrical characteristic tuning process comprises a threshold voltage tuning process as illustrated in conjunction with FIGS. 4A and 4B or a gate structure trimming process as illustrated in conjunction with FIG. 5.

Figure 7:
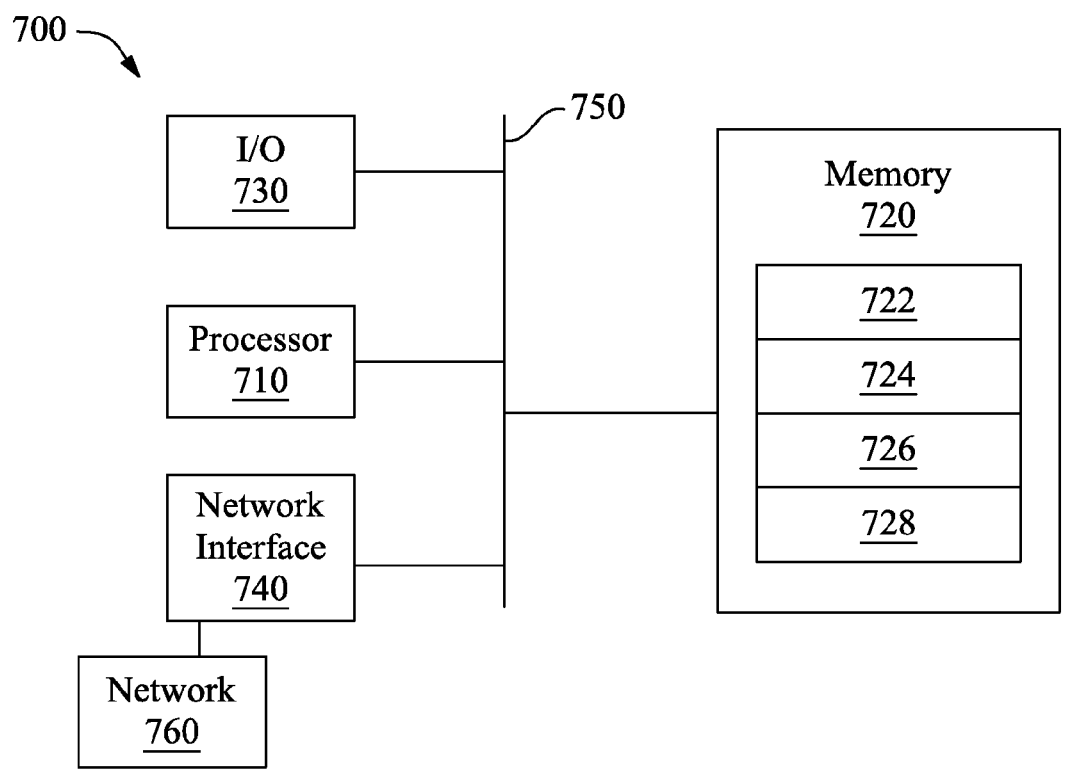
FIG. 7 is a block diagram of a layout designing system in accordance with some embodiments.

FIG. 7 is a block diagram of a layout designing system 700 in accordance with some embodiments. Layout designing system 700 is usable for implementing the method disclosed in FIG. 2 and further explained in conjunction with FIG. 1 and FIGS. 3A-3G.

System 700 includes a hardware processor 710, a non-transitory, computer readable storage medium 720, an input/output interface 730 coupled to external circuitry, and a network interface 740 communicatively coupled with one another through a bus 750.

Storage medium 720 is encoded with a set of executable instructions 722. The processor 710 is configured to execute the set of executable instructions 722 in order to cause system 700 to be usable for performing a portion or all of the operations as depicted in FIG. 2. In some embodiments, the processor 710 is a central processing unit (CPU), a multi-processor, a distributed processing system, an application specific integrated circuit (ASIC), and/or a suitable processing unit.

In some embodiments, the computer readable storage medium 720 is an electronic, magnetic, optical, electromagnetic, infrared, and/or a semiconductor system (or apparatus or device). For example, the computer readable storage medium 720 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 720 includes a compact disk-read only memory (CD-ROM), a compact disk-read/write (CD-R/W), and/or a digital video disc (DVD).

In some embodiments, the storage medium 720 stores the set of executable instructions 722 configured to cause system 700 to perform a method as depicted in FIG. 2. In some embodiments, the storage medium 720 also stores information needed for performing method 200 or generated during performing the method, such as layout design files 724, identified segments of gate structure layout patterns 726, and/or any intermediate date 728.

Network interface 740 allows system 700 to communicate with a network 760, to which one or more other computer systems are connected. Network interface 740 includes wireless network interfaces such as BLUETOOTH, WIFI, WIMAX, GPRS, or WCDMA; or wired network interface such as ETHERNET, USB, or IEEE-1394. In some embodiments, the method of FIG. 2 is implemented in two or more system, and executable instructions or layout design information are exchanged between different systems 700 via the network 760.

In accordance with one embodiment, a method of forming a layout design for fabricating an integrated circuit (IC) is disclosed. The method includes identifying one or more areas in the layout design occupied by one or more segments of a plurality of gate structure layout patterns of the layout design; and generating a set of layout patterns overlapping the identified one or more areas. The one or more areas correspond to one or more regions of the IC subject to an electrical characteristic tuning process for fabricating the IC. The plurality of gate structure layout patterns extends along a first direction and has a predetermined pitch measurable along a second direction. The predetermined pitch is smaller than a spatial resolution of a predetermined lithographic technology. The set of layout patterns corresponds to one or more openings to be formed in a mask layer prior to performing the electrical characteristic tuning process. A first layout pattern of the set of layout patterns has a width measurable along the second direction, and the width of the first layout pattern is less than twice the predetermined pitch.

In accordance with another embodiment, a method of forming a layout design for fabricating an integrated circuit (IC) is disclosed. The method includes identifying one or more areas in the layout design occupied by one or more segments of a plurality of gate structure layout patterns of the layout design; and generating a set of layout patterns overlapping the identified one or more areas. The one or more areas correspond to one or more regions of the IC subject to an electrical characteristic tuning process for fabricating the IC. The plurality of gate structure layout patterns extends along a first direction and has a predetermined pitch measurable along a second direction. The predetermined pitch is smaller than a spatial resolution of a predetermined lithographic technology. The set of layout patterns corresponds to one or more openings to be formed in a mask layer prior to performing the electrical characteristic tuning process. A first layout pattern and a second layout pattern of the set of layout patterns are separated by a first gap along the second direction, and a width of the first gap measurable along the second direction is less than twice the predetermined pitch.

In accordance with another embodiment, a layout design for fabricating an integrated circuit (IC) is disclosed. The Layout design includes a first layout layer and a second layout layer. The first layout layer includes a plurality of gate structure layout patterns. The plurality of gate structure layout patterns extends along a first direction and has a predetermined pitch measurable along a second direction, and the predetermined pitch is smaller than a spatial resolution of a predetermined lithographic technology. The second layout layer includes a set of mask layout patterns arranged based on one or more opening regions. The one or more opening regions overlap one or more of the plurality of gate structure layout patterns corresponding to one or more gate structures subject to an electrical characteristic tuning process. A first mask layout pattern of the set of mask layout patterns has a width measurable along the second direction, and the width of the first mask layout pattern is equal to the predetermined pitch.

One general aspect of embodiments described herein includes a method of manufacturing an integrated circuit (IC), the method including forming a plurality of gate structures, where at least one segment of the plurality of gate structures corresponds to a transistor to be subject to an electrical characteristic tuning process, the plurality of gate structures extending along a first direction and having a predetermined pitch measurable along a second direction, the predetermined pitch being smaller than a spatial resolution of a lithographic technology used to form the plurality of gate structures; depositing an insulating layer over the plurality of gate structures; and forming one or more openings in the insulating layer, the one or more openings having a width measurable along the second direction, the width of the respective openings being less than twice the predetermined pitch.

Another general aspect of embodiments described herein includes a method of manufacturing an integrated circuit (IC), the method including forming a plurality of transistors, the plurality of transistors including a plurality of source regions, a plurality of drain regions, and a plurality of gate structures overlying respective source regions and drain regions, the plurality of gate structures each extending along a first direction and having a predetermined pitch measurable along a second direction, the predetermined pitch being smaller than a spatial resolution of a lithographic technology used to form the plurality of gate structures; selecting a subset of the plurality of transistors for a tuning process; forming a patterned layer on the plurality of transistors, the patterned layer including a repeating pattern of features, the width of the features being less than twice the predetermined pitch; and performing the tuning process on the subset of transistors.

Yet another general aspect of embodiments described herein includes a method including: using a multiple patterning process, forming a plurality of gate structures, the plurality of gate structures extending along a first direction and having a predetermined pitch measurable along a second direction; depositing an insulating layer over the plurality of gate structures; forming one or more openings in the insulating layer, the one or more openings having a width measurable along the second direction, the width of the respective openings being less than twice the predetermined pitch; and performing an electrical characteristic tuning process on transistor structures exposed by the one or more openings The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit (IC), the method comprising:

forming a plurality of gate structures, wherein at least one segment of the plurality of gate structures corresponds to a transistor to be subject to an electrical characteristic tuning process, the plurality of gate structures extending along a first direction and having a predetermined pitch measurable along a second direction, the predetermined pitch being smaller than a spatial resolution of a lithographic technology used to form the plurality of gate structures;

depositing an insulating layer over the plurality of gate structures; and forming one or more openings in the insulating layer, the one or more openings having a width measurable along the second direction, the width of the respective openings being less than twice the predetermined pitch.

2. The method of claim 1, further comprising cutting at least one of the plurality of gate structures into two gate structures.

3. The method of claim 1, wherein each of the plurality of gate structures extends over one or more fin structures.

4. The method of claim 1, further comprising applying an electrical characteristic tuning process to the transistor to be subject to an electrical characteristic tuning process.

5. The method of claim 4, wherein the electrical characteristic tuning process is selected from the group consisting of adjusting threshold voltage, adjusting turn-on current, or adjusting leakage current.

6. The method of claim 4, wherein the electrical tuning process is selected from the group consisting of increasing an effective doping concentration of a fin structure relative to other fin structures not subjected to the electrical tuning process, decreasing an effective doping concentration of a fin structure relative to other fin structures not subjected to the electrical tuning process, and decreasing a width of a fin structure relative to other fin structures not subjected to the electrical tuning process.

7. The method of claim 4, wherein the electrical tuning process includes forming a gate electrode having a first work function for the transistor to be subject to the electrical characteristic tuning process and selecting and forming a gate electrode having a second work function, different than the first work function, for a second transistor not to be subjected to the electrical characteristic tuning process.

8. The method of claim 1, wherein at least one of the plurality of gate structures is a dummy gate structure overlapping a boundary between adjacent logic cells.

9. The method of claim 1, wherein the plurality of gate structures are formed using a multiple-patterning process.

10. A method of manufacturing an integrated circuit (IC), the method comprising:

forming a plurality of transistors, the plurality of transistors comprising a plurality of source regions, a plurality of drain regions, and a plurality of gate structures overlying respective source regions and drain regions, the plurality of gate structures each extending along a first direction and having a predetermined pitch measurable along a second direction, the predetermined pitch being smaller than a spatial resolution of a lithographic technology used to form the plurality of gate structures;

selecting a subset of the plurality of transistors for a tuning process;

forming a patterned layer on the plurality of transistors, the patterned layer including a repeating pattern of features, the width of the features being less than twice the predetermined pitch; and performing the tuning process on the subset of transistors.

11. The method of claim 10, wherein the step of forming a patterned layer on the plurality of transistors includes forming a repeating pattern of openings in the patterned layer.

12. The method of claim 10, wherein the step of forming a patterned layer on the plurality of transistors includes forming a repeating pattern of masking features in the patterned layer.

13. The method of claim 10, further comprising forming the plurality of gate structures using a multiple-patterning process.

14. The method of claim 10, wherein the subset of the plurality of transistors are dummy transistors formed at a boundary between adjacent logic cells.

15. The method of claim 10, wherein the tuning process is selected from the group consisting of adjusting threshold voltage, adjusting turn-on current, or adjusting leakage current.

16. The method of claim 10, wherein the tuning process is selected from the group consisting of increasing an effective doping concentration of the subset of transistors, decreasing an effective doping concentration of the subset of transistors, decreasing a width of a fin structure of the subset of transistors relative to other fin structures not in the subset of transistors, and forming a gate electrode having a first work function for the subset of transistors and forming a gate electrode having a second work function, different than the first work function, for transistors not in the subset of transistors.

17. The method of claim 10, further comprising cutting at least one of the plurality of gate structures to form two gate structures extending along the first direction.

18. The method of claim 10, wherein each of the plurality of gate structures extends over one or more fin structures.

19. A method comprising:

using a multiple patterning process, forming a plurality of gate structures, the plurality of gate structures extending along a first direction and having a predetermined pitch measurable along a second direction;

depositing an insulating layer over the plurality of gate structures;

forming one or more openings in the insulating layer, the one or more openings having a width measurable along the second direction, the width of the respective openings being less than twice the predetermined pitch; and performing an electrical characteristic tuning process on transistor structures exposed by the one or more openings.

20. The method of claim 19, wherein the electrical characteristic tuning process is selected from the group consisting of adjusting threshold voltage, adjusting turn-on current, or adjusting leakage current.

* * * * *